United States Patent
Yang et al.

(10) Patent No.: US 9,026,808 B2
(45) Date of Patent: May 5, 2015

(54) MEMORY WITH WORD LEVEL POWER GATING

(75) Inventors: Jianan Yang, Austin, TX (US); Mark W. Jetton, Austin, TX (US); Thomas W. Liston, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 345 days.

(21) Appl. No.: 13/457,248

(22) Filed: Apr. 26, 2012

(65) Prior Publication Data

US 2013/0290750 A1    Oct. 31, 2013

(51) Int. Cl.
| | |
|---|---|
| G06F 1/26 | (2006.01) |
| G06F 1/32 | (2006.01) |
| G06F 12/00 | (2006.01) |
| G11C 8/08 | (2006.01) |
| G11C 11/418 | (2006.01) |

(52) U.S. Cl.
CPC ............. G11C 11/418 (2013.01); G11C 8/08 (2013.01)

(58) Field of Classification Search
CPC ........ G11C 8/06; G06F 1/3275; G06F 1/3287
USPC ...................... 713/300, 320, 324; 711/1, 100
See application file for complete search history.

(56) References Cited

U.S. PATENT DOCUMENTS

| | | | | |
|---|---|---|---|---|
| 6,079,023 | A * | 6/2000 | Yoon et al. ................ | 713/300 |
| 6,552,949 | B1 | 4/2003 | Silla et al. | |
| 6,577,524 | B2 | 6/2003 | Brooks et al. | |
| 7,260,694 | B2 | 8/2007 | Flautner et al. | |
| 7,533,226 | B2 | 5/2009 | Flautner et al. | |
| 7,558,104 | B2 | 7/2009 | Sowden et al. | |
| 7,782,701 | B2 | 8/2010 | Seo et al. | |
| 8,112,652 | B2 * | 2/2012 | Sajayan et al. ............... | 713/324 |
| 2006/0039182 | A1 | 2/2006 | Sakurai et al. | |
| 2008/0158939 | A1 | 7/2008 | Chen et al. | |
| 2009/0024819 | A1 * | 1/2009 | Fisher et al. .................. | 711/170 |
| 2010/0061171 | A1 | 3/2010 | Kim et al. | |
| 2010/0128549 | A1 | 5/2010 | Dudeck et al. | |
| 2010/0191999 | A1 * | 7/2010 | Jeddeloh ........................ | 713/340 |
| 2010/0214863 | A1 | 8/2010 | Chan et al. | |
| 2012/0002499 | A1 | 1/2012 | Kinkade et al. | |
| 2012/0005512 | A1 * | 1/2012 | Chew ............................ | 713/324 |
| 2012/0147680 | A1 | 6/2012 | Koike | |
| 2012/0179923 | A1 | 7/2012 | Sasaki et al. | |
| 2013/0332763 | A1 * | 12/2013 | Palaniappan et al. ......... | 713/324 |
| 2013/0339590 | A1 | 12/2013 | Tsuruda et al. | |

OTHER PUBLICATIONS

U.S. Appl No. 13/689,331, filed Nov. 29, 2012, entitled "Memory Column Drowsy Control".

(Continued)

*Primary Examiner* — Mark Connolly (57) ABSTRACT

In accordance with at least one embodiment, memory power gating at word level is provided. In accordance with at least one embodiment, a word level power-gating technique, which is enabled by adding an extra control bit to each subarray (e.g., each word, each row, each wordline, each bitline, each portion of an array, etc.) of a memory array, provides fine-grained power reduction for a memory array. In accordance with at least one embodiment, a gating transistor is provided for each subarray (e.g., each word, each row, each wordline, each bitline, each portion of an array, etc.).

20 Claims, 5 Drawing Sheets

(56) References Cited

OTHER PUBLICATIONS

Homayoun, H. et al., "Dynamic Register File Resizing and Frequency Scaling to Improve Embedded Processor Performance and Energy-Delay Efficiency," 45th ACM/IEEE Design Automation Conference; Jun. 8-13, 2008; pp. 68-71.

Hua, Chung-Hsien et al., "Distributed Data-Retention Power Gating Techniques for Column and Row Co-Controlled Embedded SRAM," Proceedings of the 2005 IEEE International Workshop on Memory Technology, Design, and Testing; Aug. 5, 2005, pp. 129-134.

Masgonty, Jean-Marc et al., "Low-Power SRAM and ROM Memories," Workshop on Power and Timing Modeling, Optimization and Simulation (PATMOS), Yverdon-Les-Bains; 2001; 8 pages.

Non-Final Office Action mailed Nov. 6, 2014 for U.S. Appl. No. 13/689,331, 24 pages.

* cited by examiner

MEMORY WITH WORD LEVEL POWER GATING

BACKGROUND OF THE INVENTION

1. Field of the Invention

The present disclosure relates generally to electronic devices and, more specifically, to device having electronic memory.

2. Description of the Related Art

Low-power memory design has been a research area for many years, and power gating has become an industrialized technology used to place an array of memory cells into sleep mode or a shutdown mode. Such techniques can be inefficient for managing power consumption, for example, when a small portion of a memory array needs to remain active the supposed benefits of array level power gating can be largely negated.

BRIEF DESCRIPTION OF THE SEVERAL VIEWS OF THE DRAWINGS

The present invention may be better understood, and its features made apparent to those skilled in the art by referencing the accompanying drawings.

The use of the same reference symbols in different drawings indicates similar or identical items.

DETAILED DESCRIPTION OF THE INVENTION

A memory array is disclosed herein that facilitates memory power gating for subarray portions of a memory array. In accordance with at least one embodiment of the disclosure, memory power gating is enabled by adding an extra control bit to each subarray (e.g., each word, each row, each wordline, each bitline, each portion of an array, etc.) of a memory array, to implement fine-grained power reduction for a memory array. The control bit can be addressed and written to in a manner similar to other bits of the memory array. In accordance with at least one embodiment, a gating transistor is provided for each subarray (e.g., each word, each row, each wordline, each bitline, each portion of an array, etc.).

Figure 1:
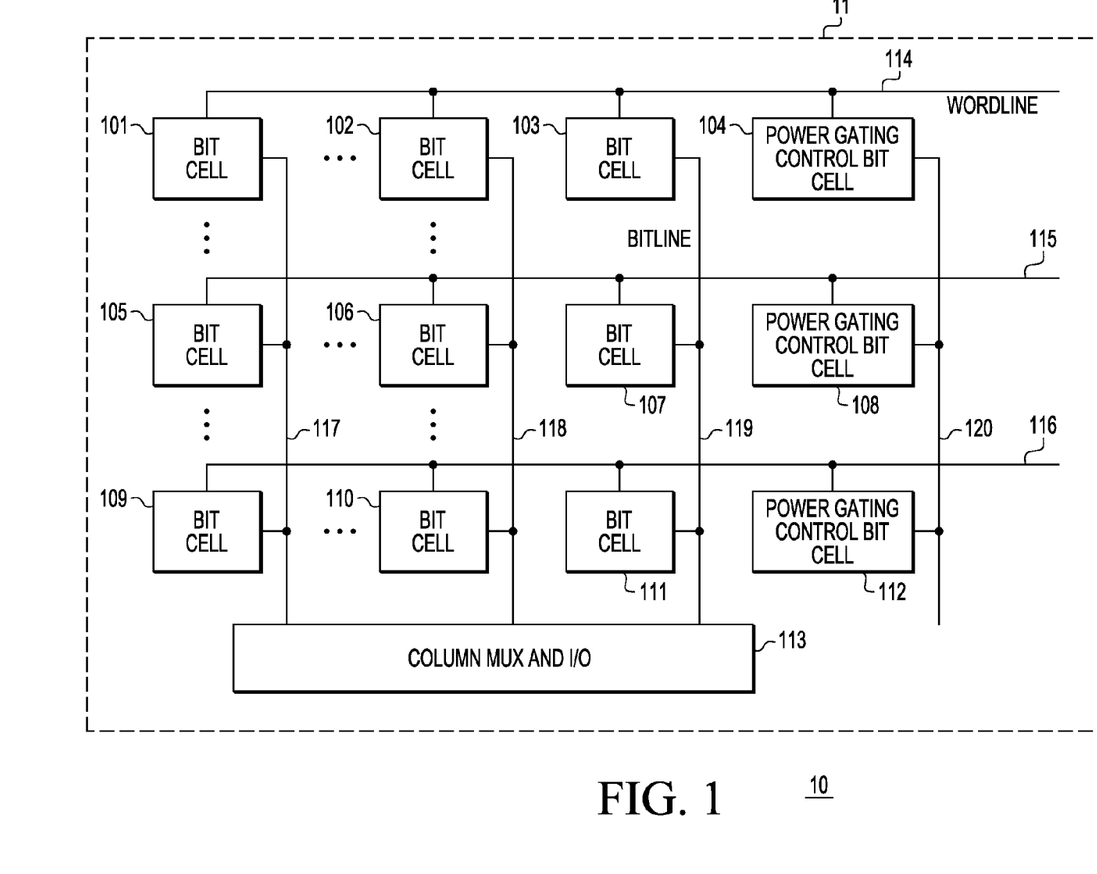
FIG. 1 is a block diagram of a low power memory device with fine granularity power gating in accordance with at least one embodiment.

FIG. 1 is a block diagram of a device 10 having a low power memory device 11 with fine granularity power gating in accordance with at least one embodiment. Device 10 is a system device that includes a memory device 11. Examples of system devices include consumer electronics, durable goods, and the like. As further examples, system devices may be implemented as battery powered apparatus, such as handheld devices and other portable devices. Also, system devices may include electronics powered by utility power sources, alternative power sources, such as solar power sources, kinetic power sources (e.g., piezoelectric power sources), biologically active power sources, etc. The low power memory device 11 comprises data memory cell 101, data memory cell 102, data memory cell 103, power control memory cell 104, data memory cell 105, data memory cell 106, data memory cell 107, power control memory cell 108, data memory cell 109, data memory cell 110, data memory cell 111, power control memory cell 112, and column multiplexer (mux) and input/output (I/O) circuit 113.

The low power memory device 11 comprises a memory array comprising rows of data memory cells. A first row comprises data memory cells 101, 102, and 103. A second row comprises data memory cells 105, 106, and 107. A third row comprises data memory cells 109, 110, and 111. The number of rows illustrated is merely exemplary, and embodiments may be implemented with other numbers of rows.

The data memory cells of the memory array also comprise columns. A first column of the columns comprises data memory cells 101, 105, and 109. A second column comprises data memory cells 102, 106, and 110. A third column comprises data memory cells 103, 107, and 111. The number of columns illustrated is merely exemplary, and embodiments may be implemented with other numbers of columns.

In accordance with at least one embodiment, a power control memory cell is provided for each row of the low power memory device. For example, power control memory cell 104 is provided for the first row, power control memory cell 108 is provided for the second row, and power control memory cell 112 is provided for the third row. As an example, power control memory cell 104 provides power control to enable and disable power for data memory cells 101, 102, and 103, power control memory cell 108 provides power control to enable and disable power for data memory cells 105, 106, and 107, and power memory cell 112 provides power control to enable and disable power for data memory cells 109, 110, and 111. In accordance with at least one embodiment, each row of the memory array stores one word of data, allowing each power control memory cell to provide power control for a single memory word (i.e., word level power control granularity).

A wordline 114 is connected to data memory cells 101, 102, and 103 and to power control memory cell 104, a wordline 115 is connected to data memory cells 105, 106, and 107 and to power control memory cell 108, a wordline 116 is connected to data memory cells 109, 110, and 111 and to power control memory cell 112. A bitline 117 is connected to data memory cells 101, 105, and 109, a bitline 118 is connected to data memory cells 102, 106, and 110, and a bitline 119 is connected to data memory cells 103, 107, and 111. Bitlines 117, 118, and 119 are connected to column multiplexer (mux) and input/output (I/O) circuit 113, which allows access to the data bits of a word stored in data memory cells selected by, for example, one of wordlines 114, 115, and 116. A bitline 120 is connected to power control memory cells 104, 108, and 112, which allows access to the power control bits stored in power control memory cells selected by, for example, one of wordlines 114, 115, and 116. Bitline 120 for the power control memory cells 104, 108, and 112 is implemented as a special input/output (I/O) line separate from bitlines 117, 118, and 119 connected to column multiplexer (mux) and input/output (I/O) circuit 113 so as to allow independent access to the power control memory cells 104, 108, and 112 to allow reading and writing of power control bits stored in power control cells 104, 108, and 112.

Figure 2:
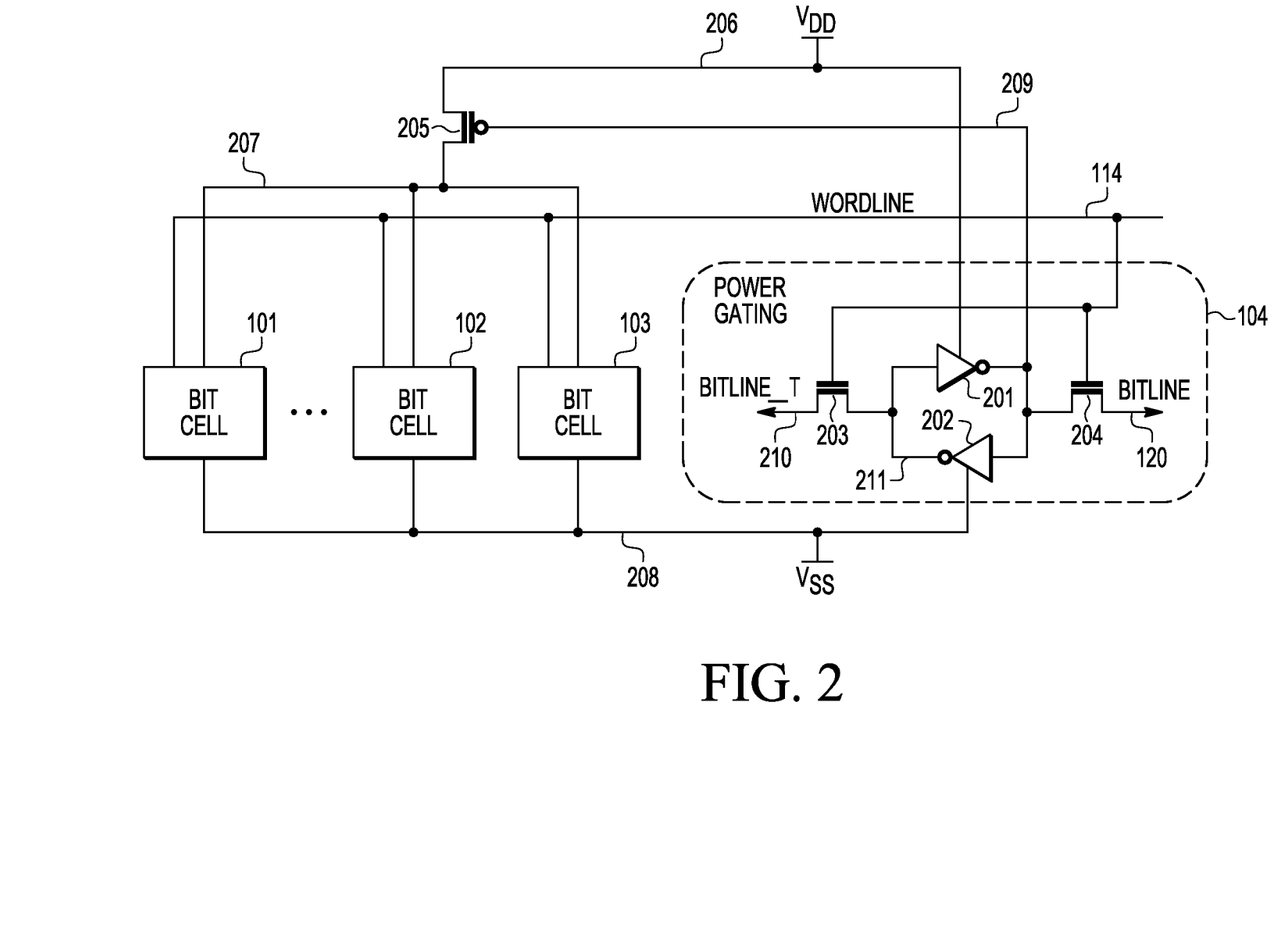
FIG. 2 is a schematic diagram of a row of memory cells with fine granularity power gating in accordance with at least one embodiment.

FIG. 2 is a schematic diagram of a row of memory cells with fine granularity power gating in accordance with at least one embodiment. The row of memory cells comprises data memory cells 101, 102, and 103. Power control memory cell 104 is provided for the row of memory cells and controls power to the row of memory cells, allowing the row of memory cells to be enabled and disabled. Wordline 114 is connected to data memory cells 101, 102, and 103 and to power control memory cell 104. Bitline 120 is connected to power control memory cell 104.

In accordance with at least one embodiment, power control memory cell 104 comprises inverter 201, inverter 202, negative type (n type) channel (n channel) metal oxide semiconductor (MOS) field effect transistor (FET) (i.e., NMOS FET) 203, and NMOS FET 204. Bitline 120 is connected to a first source/drain terminal of NMOS FET 204. Wordline 114 is connected to a gate terminal of NMOS FET 204. A second source/drain terminal of NMOS FET 204 is connected to node 209, which is connected to an output of inverter 201, to an input of inverter 202, and to a gate terminal of positive type (p type) channel (p channel) metal oxide semiconductor (MOS) field effect transistor (FET) (i.e., PMOS FET) 205, which functions as a data cell power switch. In accordance with at least one embodiment, node 209 serves as the output of power control memory cell 104, and the logic state of node 209 is the state of power control memory cell 104. A drain terminal of PMOS FET 205 is connected to node 207, which is connected to positive supply terminals of data memory cells 101, 102, and 103.

The output of inverter 202 is connected to node 211, which is connected to the input of inverter 201 and to a first source/drain terminal of NMOS FET 203. Wordline 114 is connected to a gate terminal of NMOS FET 203. A second source/drain terminal of NMOS FET 203 is connected to node 210. In accordance with at least one embodiment, node 210 can be used for power control of a wordline driver.

Positive supply voltage (e.g., Vdd) 206 is connected to a source terminal of PMOS FET 205 and to a positive supply terminal of power control memory cell 104. For example, the positive supply terminal of power control memory cell 104 may be connected to a positive supply terminal of inverter 201 and to a positive supply terminal of inverter 202. Negative supply voltage (e.g., Vss) 208 is connected to negative supply terminals of data memory cells 101, 102, and 103, and to a negative supply terminal of power supply memory cell 104. For example, the negative supply terminal of power control cell 104 may be connected to a negative supply terminal of inverter 201 and to a negative supply terminal of inverter 202.

In accordance with at least one embodiment, by selecting the row of memory cells 101, 102, and 103 and the power control memory cell 104 by asserting wordline 114, the state of power control memory cell 104 (i.e., the power control bit stored in power control memory cell 104) can be accessed via bitline 120 through NMOS FET 204, which is enabled by asserting wordline 114. When the power control bit stored in power control memory cell 104 is a logical zero, the corresponding low logic level is applied to the gate of PMOS FET 205, causing PMOS FET 205 to conduct and to apply positive supply voltage 206 to node 207 and the positive supply terminals of data memory cells 101, 102, and 103, thereby placing data memory cells 101, 102, and 103 into an active mode in which they are fully operational. When the power control bit stored in power control memory cell 104 is a logical one, the corresponding high logic level is applied to the gate of PMOS FET 205, causing PMOS FET 205 to stop conducting and to stop applying positive supply voltage 206 to node 207 and the positive supply terminals of data bit cells 101, 102, and 103, thereby placing data memory cells 101, 102, and 103 in an inactive mode, thereby saving power.

By virtue of inverters 201 and 202, a logical zero at node 209 is inverted to be a logical one at node 211, and a logical one at node 209 is inverted to be a logical zero at node 211. When wordline 114 is asserted, it applies a positive logic level to the gate of NMOS FET 203, causing NMOS FET 203 to conduct and to provide the logic level present at node 211 to node 210. Thus, node 210 is provided with an inverted logic level as compared with the logic level present at node 209 and, therefore, the state of power control memory cell 104. In accordance with at least one embodiment, the logic level present at node 210 is used, in conjunction with additional circuitry, for power control of a wordline driver associated with wordline 114. In accordance with at least one embodiment, the logic level present at node 211 is used, in conjunction with additional circuitry, for power control of a wordline driver associated with wordline 114. In accordance with at least one embodiment, the logic level present at node 209 is used, in conjunction with additional circuitry, for power control of a wordline driver associated with wordline 114. In accordance with at least one embodiment, the logic level at node 211 is used, instead of the logic level at node 209, to control PMOS FET 205 and to provide power control of data memory cells 101, 102, and 103. In accordance with at least one embodiment, an NMOS FET between negative supply terminals of data memory cells 101, 102, and 103 and negative supply voltage 208 is used instead of, or in conjunction with, PMOS FET 205 to act as a data cell power switch to control power for data cells 101, 102, and 103, wherein a gate of such NMOS FET would be connected to either node 209 or node 211.

Figure 3:
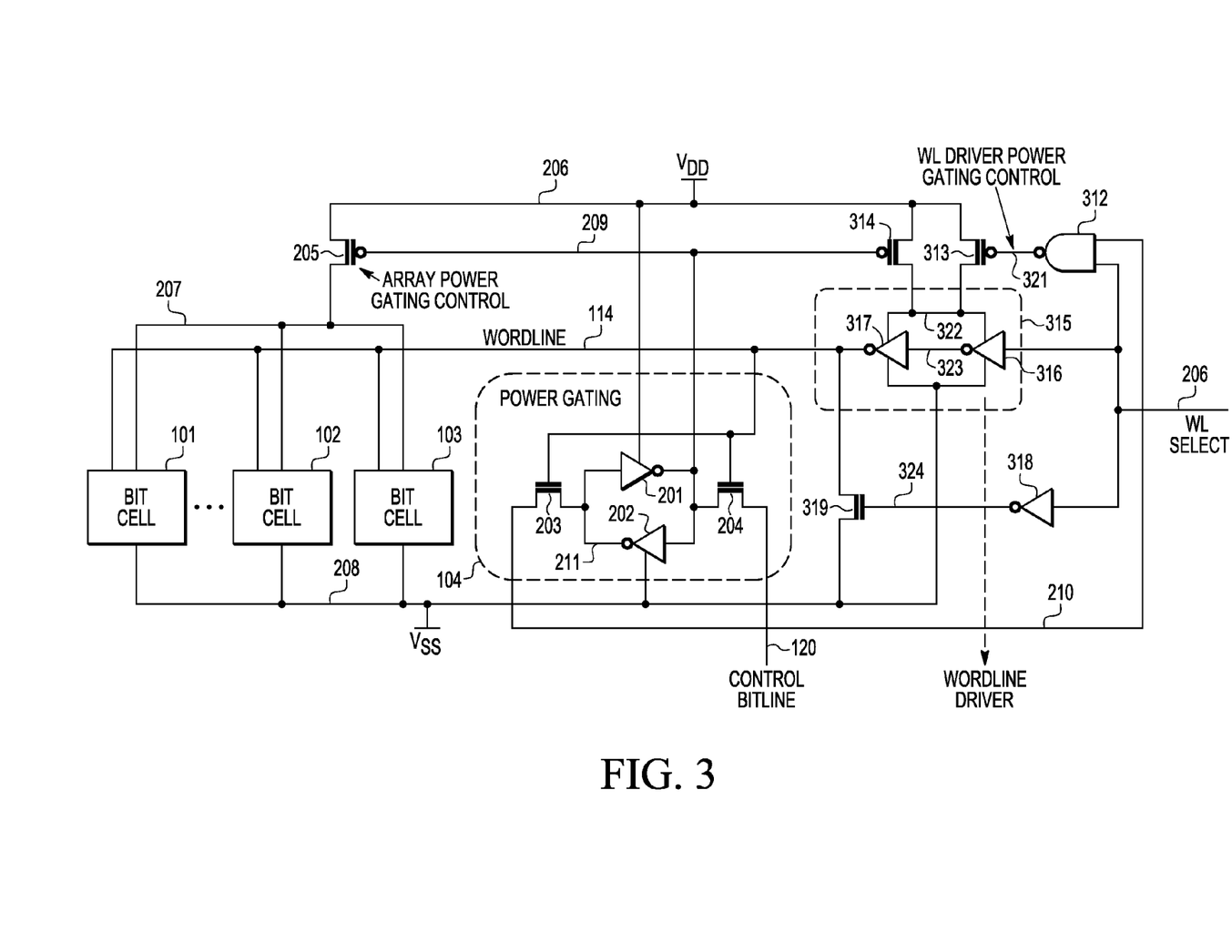
FIG. 3 is a schematic diagram of a row of memory cells with fine granularity power gating including wordline driver power gating in accordance with at least one embodiment.

FIG. 3 is a schematic diagram of a row of memory cells with fine granularity power gating including wordline driver power gating in accordance with an alternate embodiment. The row of memory cells comprises data memory cells 101, 102, and 103. Power control memory cell 104 is provided for the row of memory cells and controls power to the row of memory cells, allowing the row of memory cells to be enabled and disabled. Wordline 114 is connected to data memory cells 101, 102, and 103 and to power control memory cell 104. Bitline 120 is connected to power control memory cell 104.

Power control memory cell 104 comprises inverter 201, inverter 202, negative type (n type) channel (n channel) metal oxide semiconductor (MOS) field effect transistor 203, and NMOS FET 204. Bitline 120 is connected to a first source/drain terminal of NMOS FET 204. Wordline 114 is connected to a gate terminal of NMOS FET 204. A second source/drain terminal of NMOS FET 204 is connected to node 209, which is connected to an output of inverter 201, to an input of inverter 202, to a gate terminal of positive type (p type) channel (p channel) metal oxide semiconductor (MOS) field effect transistor (FET) 205, which functions as a data cell power switch, and to a gate terminal of PMOS FET 314, which, in conjunction with PMOS FET 313, functions as a wordline driver power switch. In accordance with at least one embodiment, node 209 serves as the output of power control memory cell 104, and the logic state of node 209 is the state of power control memory cell 104. A drain terminal of PMOS FET 205 is connected to node 207, which is connected to positive supply terminals of data memory cells 101, 102, and 103.

The output of inverter 202 is connected to node 211, which is connected to the input of inverter 201 and to a first source/drain terminal of NMOS FET 203. Wordline 114 is connected to a gate terminal of NMOS FET 203. A second source/drain terminal of NMOS FET 203 is connected to node 210, which is connected to an input of inverting logical AND (i.e., NAND) gate 312. In accordance with at least one embodiment, node 210 can be used for power control of a wordline driver.

Positive supply voltage 206 is connected to a source terminal of PMOS FET 205, to a positive supply terminal of power control memory cell 104, to a source terminal of PMOS FET 314, to a source terminal of PMOS FET 313, to a positive supply terminal of NAND gate 312, and to a positive supply terminal of inverter 318. For example, the positive supply terminal of power control memory cell 104 may be connected to a positive supply terminal of inverter 201 and to a positive supply terminal of inverter 202. Negative supply voltage 208 is connected to negative supply terminals of data memory cells 101, 102, and 103, to a negative supply terminal of power supply memory cell 104, to a negative supply terminal of wordline driver 315, to a negative supply terminal of NAND gate 312, and to a negative supply terminal of inverter 318. For example, the negative supply terminal of power control cell 104 may be connected to a negative supply terminal of inverter 201 and to a negative supply terminal of inverter 202. For example, the negative supply terminal of wordline driver 315 may be connected to a negative supply terminal of inverter 316 and to a negative supply terminal of inverter 317.

A wordline select line 320 is connected to a second input of NAND gate 312, to an input of wordline driver 315, and to an input of inverter 318. For example, the input of wordline driver 315 may be connected to an input of inverter 316.

An output of NAND gate 312 is connected to node 321, which is connected to a gate terminal of PMOS FET 313, which, in conjunction with PMOS FET 314, acts as a wordline driver power switch. A drain of PMOS FET 313 and a drain of PMOS FET 314 are connected to node 322, which is connected to a positive supply terminal of inverter 316 and to a positive supply terminal of inverter 317. An output of inverter 316 is connected to an input of inverter 317, thereby restoring the same logic level at wordline 114, which is connected to the output of inverter 317, as is present at wordline select line 320, provided wordline driver 315 is enabled.

An output of inverter 318 is connected to node 324, which is connected to a gate of NMOS FET 319. A source terminal of NMOS FET 319 is connected to negative supply voltage 208. A drain terminal of NMOS FET 319 is connected to wordline 114.

By selecting the row of memory cells 101, 102, and 103 and the power control memory cell 104 by asserting wordline 114, the state of power control memory cell 104 (i.e., the power control bit stored in power control memory cell 104) can be accessed via bitline 120 through NMOS FET 204, which is enabled by asserting wordline 114. When the power control bit stored in power control memory cell 104 is a logical zero, the corresponding low logic level is applied to the gate of PMOS FET 205, causing PMOS FET 205 to conduct and to apply positive supply voltage 206 to node 207 and the positive supply terminals of data memory cells 101, 102, and 103, thereby placing data memory cells 101, 102, and 103 into an active mode in which they are fully operational. When the power control bit store in power control memory cell 104 is a logical one, the corresponding high logic level is applied to the gate of PMOS FET 205, causing PMOS FET 205 to stop conducting and to stop applying positive supply voltage 206 to node 207 and the positive supply terminals of data bit cells 101, 102, and 103, thereby placing data memory cells 101, 102, and 103 in an inactive mode, thereby saving power.

By virtue of inverters 201 and 202, a logical zero at node 209 is inverted to be a logical one at node 211, and a logical one at node 209 is inverted to be a logical zero at node 211. When wordline 114 is asserted, it applies a positive logic level to the gate of NMOS FET 203, causing NMOS FET 203 to conduct and to provide the logic level present at node 211 to node 210. Thus, node 210 is provided with an inverted logic level as compared with the logic level present at node 209 and, therefore, the state of power control memory cell 104. The logic level present at node 210 is used, in conjunction with additional circuitry, for power control of a wordline driver associated with wordline 114. In accordance with at least one embodiment, the logic level present at node 211 is used, in conjunction with additional circuitry, for power control of a wordline driver associated with wordline 114. The logic level present at node 209 is used, in conjunction with additional circuitry, for power control of a wordline driver associated with wordline 114. The logic level at node 211 is used, instead of the logic level at node 209, to control PMOS FET 205 and to provide power control of data memory cells 101, 102, and 103. An NMOS FET between negative supply terminals of data memory cells 101, 102, and 103 and negative supply voltage 208 is used instead of, or in conjunction with, PMOS FET 205 to act as a data cell power switch to control power for data cells 101, 102, and 103, wherein a gate of such NMOS FET would be connected to either node 209 or node 211.

When wordline select line 320 is at a low logic level (e.g., logical zero), inverter 318 inverts such low logic level to a high logic level (e.g., logical one), which is applied to the gate of NMOS FET 319, causing NMOS FET 319 to conduct and pull wordline 114 to a low logic level. When wordline select line 320 is at a high logic level and node 209 at the output of power control memory cell 104 is at a low logic level, data memory cells 101, 102, and 103 are intended to be active, and the low logic level at node 209 is applied to the gate of PMOS FET 314, causing it to conduct and supply power to wordline driver 315, which passes the high logic level of wordline select line 320 to wordline 114, allowing wordline 114 to enable access to data memory cells 101, 102, and 103 and to power control memory cell 104. When wordline select line 320 is at a high logic level and node 209 at the output of power control memory cell 104 is at a low logic level, data memory cells 101, 102, and 103 are intended to be inactive (e.g., powered down), and the high logic level at node 209 is applied to the gate of PMOS FET 314, causing it to stop conducting and to stop supplying power to wordline driver 315.

However, wordline driver 315 can alternatively receive power through PMOS FET 313 instead of PMOS FET 314 if both inputs of NAND gate 312 are at a high logic level, thereby applying a low logic level to the gate terminal of PMOS FET 313, causing PMOS FET 313 to conduct and provide power to wordline driver 315. If wordline select line 320 is at a high logic level, PMOS FET 313 will be caused to conduct if node 210 is raised to a high logic level. However, since PMOS FET 314 will already be conducting when power control memory cell 104 is outputting a low logic level at node 209, conduction of PMOS FET 313 would be redundant when power control memory cell 104 is outputting a low logic level at node 209. When power control memory cell 104 is outputting a high logic level at node 209, node 211 will be at a low logic level. If the inputs of NAND gate 312 default to a high logic level state when they are not being actively driven high or low, or if a current path to a high logic level (e.g., a pullup resistor to positive supply voltage (Vdd) 206) is provided, node 210 will effectively be raised to a high logic level when NMOS FET 203 is not conducting, which will be the case when wordline 114 is at a low logic level, as it will be when pulled low by inverter 318 and NMOS FET 319 when wordline select line 320 is at a low logic level.

Therefore, while power control memory cell 104 is in a power saving mode and is outputting a high logic level at node 209 and wordline select line 320 transitions from a low logic level to a high logic level, the high logic level of the wordline select line 320 and the high logic level at the inverted control bitline node 210 will bring the output of NAND 312 at node 321 low, thereby causing PMOS FET 322 to conduct and to provide power to wordline driver 315, which will drive wordline 114 with the high logic level (i.e., logical one) of wordline select line 320, thereby allowing control bitline 120 and inverted control bitline 210 to access power control memory cell 104. If control bitline 120 writes a low logic level to the output of power control memory cell 104 at node 209, that low logical level will cause PMOS FET 314 to conduct, thereby maintaining continued power supply to wordline driver 315. However, if control bitline 120 does not write a low logic level to the output of power control memory cell 104 at node 209, the high logic level appearing at wordline 114 will cause NMOS FET 203 to conduct, pulling node 210 low to the low logic level present at node 211, which will cause the output of NAND gate 312 at node 321 to go high, very quickly turning off the power being supplied to wordline driver 315. Thus, NMOS FET 203, NAND gate 312, and PMOS FET 313 function to provide a way to reactivate a row of memory after that row has been inactive (e.g., a way to wake up that row of memory from a sleep mode). Using complementary control bitlines, such that node 210 is connected to an inverted control bitline, a high logic level is applied to control bitline 120 and a low logic level is applied to the inverted control bitline at node 210 to place the power control memory cell 104 into an inactive (e.g., power saving) mode when wordline 114 is activated, and a low logic level is applied to control bitline 120 and a high logic level is applied to the inverted control bitline at node 210 to place the power control memory cell 104 into an active mode when wordline 114 is activated. In such case, the application of a high logic level to the inverted control bitline connected to node 210, in combination with a high logic level on the wordline select line 320, drives the output of NAND gate 312 at node 321 low, turning on PMOS FET 313 and applying power to wordline driver 315, thereby allowing the data memory cells of the row to be restored to an active mode from an inactive mode (e.g., to wake up from a sleep mode).

Accordingly, wordline 114 follows the state of wordline select line 320 when power control memory cell 104 has a low logic level, but, when power control memory cell 104 has a high logic level, wordline 114 has a low logic level when wordline select line 320 has a low logic level but wordline 114 changes to a high logic level long enough to allow control bitline 120 to access the power control memory cell 104, with wordline 114 either remaining at a high logic level if control bitline 120 writes a low logic level to power control memory cell 104 or promptly returning to a low logic level if control bitline 120 does not write a low logic level to power control memory cell 104.

Figure 4:
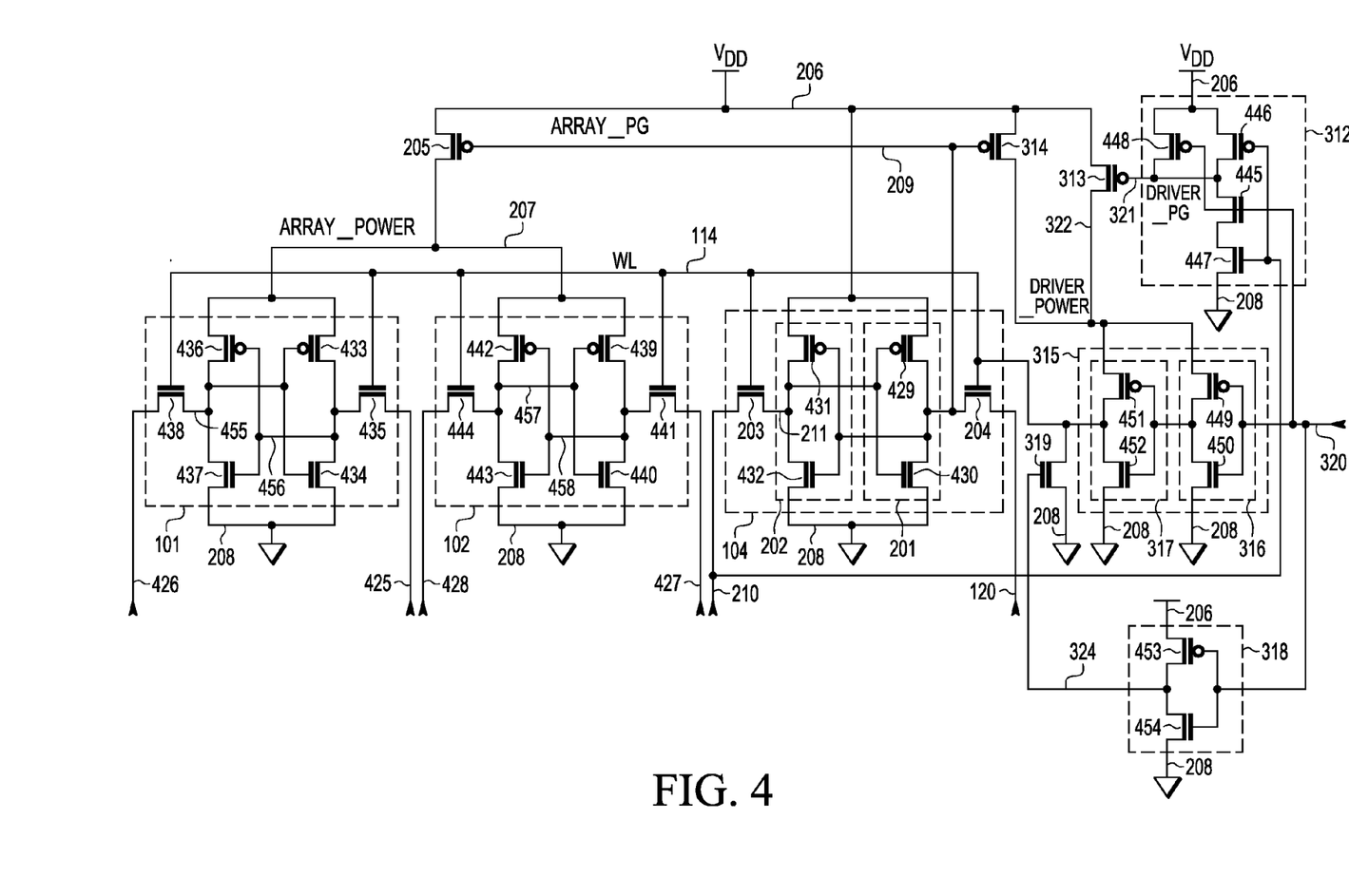
FIG. 4 is a more detailed schematic diagram of a row of memory cells with fine granularity power gating including wordline driver power gating in accordance with at least one embodiment.

FIG. 4 is a more detailed schematic diagram of a row of memory cells with fine granularity power gating including wordline driver power gating in accordance with at least one embodiment. The reference numerals of FIG. 4 which also appear in one or more of FIGS. 1, 2, and 3 represent the same elements illustrated in those drawings and described in the preceding text. Thus, FIG. 4 is a more specific embodiment of the embodiment illustrated in FIG. 3.

Data memory cell 101 comprises PMOS FET 433, NMOS FET 434, NMOS FET 435, PMOS FET 436, NMOS FET 437, and NMOS FET 438. PMOS FET 433 and NMOS FET 434 form an inverter having an input at node 455 and an output at node 456. PMOS FET 436 and NMOS FET 437 form an inverter having an input at node 456 and an output at node 455. Node 456 is selectively connected to bitline 425 through NMOS FET 435, which has its gate terminal connected to wordline 114. Node 455 is selectively connected to inverted bitline 426 through NMOS FET 438, which has its gate terminal connected to wordline 114.

Data memory cell 102 comprises PMOS FET 439, NMOS FET 440, NMOS FET 441, PMOS FET 442, NMOS FET 443, and NMOS FET 444. PMOS FET 439 and NMOS FET 440 form an inverter having an input at node 457 and an output at node 458. PMOS FET 442 and NMOS FET 443 form an inverter having an input at node 458 and an output at node 457. Node 458 is selectively connected to bitline 427 through NMOS FET 441, which has its gate terminal connected to wordline 114. Node 457 is selectively connected to inverted bitline 428 through NMOS FET 444, which has its gate terminal connected to wordline 114.

Inverter 201 comprises PMOS FET 429 and NMOS FET 430. Inverter 202 comprises PMOS FET 431 and NMOS FET 432. The input of inverter 201 is connected to the gate terminals of PMOS FET 429 and NMOS FET 430. The input of inverter 202 is connected to the gate terminals of PMOS FET 431 and NMOS FET 432. The source terminals of PMOS FET 429 and PMOS FET 431 are connected to positive supply voltage 206. The source terminals of NMOS FET 430 and NMOS FET 432 are connected to negative supply voltage 208. The output of inverter 201 is obtained from the junction of the drain terminals of PMOS FET 429 and NMOS FET 430. The output of inverter 202 is obtained from the junction of the drain terminals of PMOS FET 431 and NMOS FET 432.

Inverter 316 comprises PMOS FET 449 and NMOS FET 450. Inverter 317 comprises PMOS FET 451 and NMOS FET 452. The input of inverter 316 is connected to the gate terminals of PMOS FET 449 and NMOS FET 450. The input of inverter 317 is connected to the gate terminals of PMOS FET 451 and NMOS FET 452. The source terminals of PMOS FET 449 and PMOS FET 451 are connected to node 322. The source terminals of NMOS FET 450 and NMOS FET 452 are connected to negative supply voltage 208. The output of inverter 316 is obtained from the junction of the drain terminals of PMOS FET 449 and NMOS FET 450. The output of inverter 317 is obtained from the junction of the drain terminals of PMOS FET 451 and NMOS FET 452.

Inverter 318 comprises PMOS FET 453 and NMOS FET 454. The input of inverter 318 is connected to the gate terminals of PMOS FET 453 and NMOS FET 454. The source terminal of PMOS FET 453 is connected to positive supply voltage 206. The source terminal of NMOS FET 454 is connected to negative supply voltage 208. The output of inverter 318 is obtained from the junction of the drain terminals of PMOS FET 453 and NMOS FET 454.

Inverting logical AND gate (NAND gate) 312 comprises NMOS FET 445, PMOS FET 446, NMOS FET 447, and PMOS FET 448. Wordline select line 320 is connected to the gates of NMOS FET 445 and PMOS FET 448 as an input to NAND gate 312. Node 210 is connected to the gates of PMOS FET 446 and NMOS FET 447 as another input to NAND gate 312. A positive supply voltage 206 is connected to the source terminals of PMOS FETs 446 and 448. A negative supply voltage 208 is connected to the source terminal of NMOS FET 447. The output of NAND gate 312 is connected to drains of PMOS FETs 446 and 448 and to the drain of NMOS FET 445. The drain of NMOS FET 447 is connected to the source of NMOS FET 445.

Figure 5:
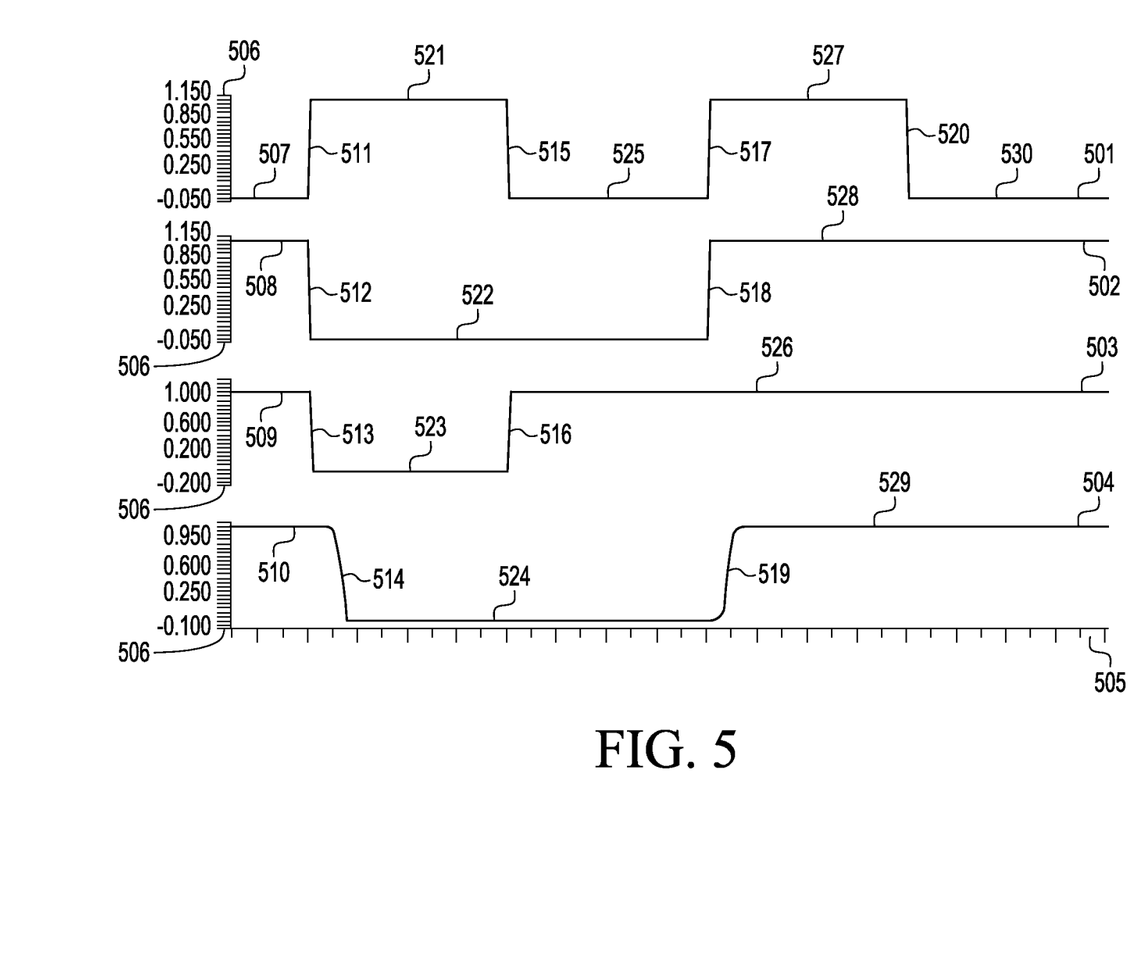
FIG. 5 is a timing diagram of a low power memory device with fine granularity power gating in accordance with at least one embodiment.

FIG. 5 is a timing diagram of a low power memory device with fine granularity power gating in accordance with at least one embodiment. The timing diagram illustrates a wordline select line signal of wordline select line 320 as waveform 501, a control bitline signal of control bitline 120 as waveform 502, a wordline driver power gating control signal of node 321 as waveform 503, and an array power gating control signal of node 207 as waveform 504. Waveforms 501, 502, 503, 504, and 505 are illustrated relative to x axis 505, which represents time, and y axis 506, which represents voltage, with individual voltage scales along y axis 506 for each of waveforms 501, 502, 503, and 504.

Waveform 501 begins at a low logic level for duration 507. Waveform 502 begins at a high logic level for duration 508. Waveform 503 begins at a high logic level for duration 509. Waveform 504 begins at a high logic level 510. Waveform 501 makes a transition 511 to a high logic level, where it remains for duration 521. Approximately simultaneous with transition 511, waveform 502 makes a transition 512 to a low logic level, where it remains for duration 522. Approximately simultaneous with transitions 511 and 512, waveform 503 makes a transition 513 to a low logic level, where it remains for duration 523. Slightly after transitions 511, 512, and 513, waveform 505 makes a transition 514 to a low logic level, where it remains for duration 524. After duration 521, which is approximately as long as duration 523, waveform 501 makes a transition 515 to a low logic level, where it remains for duration 525. Approximately simultaneous with transition 515, waveform 503 makes a transition 516 to a high logic level, where it remains for duration 526.

After duration 525, waveform 501 makes a transition 517 to a high logic level, where it remains for duration 527. Approximately simultaneous with transition 517, waveform 502 makes a transition 518 to a high logic level, where it remains for duration 528. Slightly after transitions 517 and 518, waveform 504 makes a transition 519 to a high logic level, where it remains for duration 529. After duration 527, waveform 501 makes a transition 520 to a low logic level, where it remains for duration 530.

When wordline select line 320 is not asserted (e.g., is at a low logic level), as shown by waveform 501, the wordline driver power gating control signal remains in a power saving mode (e.g., at a high logic level), as shown by waveform 503. Even when wordline select line 320 is asserted (e.g., is at a high logic level), if the control bitline signal is in a power saving mode (e.g., is at a high logic level) (and the inverted bitline signal, if any, is also in a power saving mode (e.g., is at a low logic level)), as shown by waveform 502, the wordline driver power gating control signal remains in a power saving mode (e.g., at a high logic level), as shown by waveform 503. Thus, only when the wordline select line signal shown in waveform 501 is active (e.g., at a high logic level) and the control bitline signal shown in waveform 502 is in an operational mode (e.g., at a low logic level) does the wordline driver power gating control signal shown in waveform 503 enable power to the wordline driver. As can be seen from waveforms 504 and 502, the array power gating control signal of waveform 504 follows the control bitline signal of waveform 502, but with a slight delay.

In accordance with at least one embodiment, a power control memory cell is implemented separately from the memory array comprising the data memory cells whose power is controlled by the power control memory cell. For example, the power control memory cell may be implemented in a central control unit, where one or multiple of these control bits may be written when selected. Control signals would still be routed to each wordline.

In accordance with at least one embodiment, the granularity with which memory cells can be enabled and disabled is one word. Use a bit-cell-like storage element for storage of fine-grained power gating control information to allow implementation of fine-grained power gating control allows access to such a storage element in the same manner as a normal array bit cell for storage of user data is accessed. In accordance with at least one embodiment, the granularity with which memory cells can be enabled and disabled is more than one word. In accordance with at least one embodiment, the granularity with which memory cells can be enabled and disabled is variable. For example, power gating control may be implemented to allow multiple wordlines to be activated as a group, wherein various circuit techniques may be employed to update values of multiple control bits in one write.

In accordance with at least one embodiment, power is routed independently to each word of data memory cells. In accordance with at least one embodiment, power is routed independently to each wordline driver. As an example, independent power routing can be practically achieved by connecting all the array elements (i.e. bitcells) to a first power supply (e.g., Vdda), while the wordline drivers are connected to a second power supply (e.g., Vddw). All other peripheral control circuitry would then be attached to a third power supply (e.g., Vddp).

In accordance with at least one embodiment, memory power gating at word level is provided. In accordance with at least one embodiment, a word level power-gating technique, which is enabled by adding an extra control bit to each subarray (e.g., each word, each row, each wordline, each bitline, each portion of an array, etc.) of a memory array, provides fine-grained power reduction for a memory array. In accordance with at least one embodiment, a gating transistor is provided for each subarray (e.g., each word, each row, each wordline, each bitline, each portion of an array, etc.). In accordance with at least one embodiment, a power-gating current spike is relaxed. Fine-grained power reduction allows current flow associated with activation or deactivation of portions of a memory array to be commensurately reduced, thereby reducing any current spikes associated with power gating. In accordance with at least one embodiment, dynamic memory resizing is enabled. For example, rather than simply turning on or off large amounts of memory, small amounts and/or varying amounts of memory may be selectively activated or deactivated so as to precisely tailor power and accessibility of portions of a memory array even on an ongoing basis over time. In accordance with at least one embodiment, memory power consumption can be reduced even in memory usage situations where memory power reduction was heretofore hindered. For example, if only a few memory words in a large block of a memory array need to remain active, activation of only those few memory words can be achieved while saving power over the majority of the large block of the memory array by powering down the remainder of the large block of the memory array.

In accordance with at least one embodiment, a method for memory power reduction comprises controlling a power control memory cell state of a power control memory cell based on a power control selection line state of a power control selection line. In accordance with at least one embodiment, the power control memory cell is selectively coupled to the power control selection line. In accordance with at least one embodiment, the method further comprises gating power to data memory cells of a subarray of a memory array based on the power control memory cell state. In accordance with at least one embodiment, the method further comprises gating an addressing line for selectively enabling and disabling addressing of the subarray based on the power control memory cell state. In accordance with at least one embodiment, the step of gating the addressing line further comprises gating the addressing line further based on an addressing line state of the addressing line. In accordance with at least one embodiment, the step of gating the addressing line further comprises gating of power to an addressing line driver for the addressing line.

In accordance with at least one embodiment, the power control selection line comprises an addressable line. In accordance with at least one embodiment, the power control memory cell is selectively coupled to the power control selection line by asserting an address line when the data memory cells of the subarray are addressed by assertion the address line. In accordance with at least one embodiment, the method further comprises controlling a second power control memory cell state of a second power control memory cell based on a second power control selection line state of the power control selection line, in response to the second power control memory cell being selectively coupled to the power control selection line; wherein the power control selection line is a bitline common to the power control memory cell and the second power control memory cell. In accordance with at least one embodiment, the method further comprises gating power to second data memory cells of a second subarray of the memory array based on the second power control memory cell state.

In accordance with at least one embodiment, the addressing line is a wordline. In accordance with at least one embodiment, the power control selection line is a control bitline.

In accordance with at least one embodiment, apparatus comprises a power control memory cell, a data memory cell power switch, and a memory array comprising a plurality of subarrays, wherein the plurality of subarrays comprises a first subarray and other subarrays, wherein the first subarray comprise a plurality of data memory cells. In accordance with at least one embodiment, the data memory cell power switch coupled to and controlled by a power control memory cell state of the power control memory cell. In accordance with at least one embodiment, the data memory cell power switch is coupled to and controls power to the plurality of data memory cells.

In accordance with at least one embodiment, the apparatus further comprises complementary bit lines coupled to the power control memory cell wherein the power control memory cell state of the power control memory cell is set by a bit line state of the complementary bit lines.

In accordance with at least one embodiment, an addressing line that controls writing to the power control memory cell is provided by a wordline driver. In accordance with at least one embodiment, the addressing line is a wordline. In accordance with at least one embodiment, the power control memory cell state is based on a control bitline state of a control bitline. In accordance with at least one embodiment, the control bitline is selectively coupled to the power control memory cell.

In accordance with at least one embodiment, the other subarrays comprise other data memory cells. In accordance with at least one embodiment, the data memory cell power switch does not control power to the other data memory cells. In accordance with at least one embodiment, the apparatus further comprises an addressing line driver. In accordance with at least one embodiment, the addressing line driver is for selectively driving a disableable addressing line based on the power control memory cell state. In accordance with at least one embodiment, the addressing line driver is for driving the disableable addressing line further based on an addressing line state of the addressing line. In accordance with at least one embodiment, the disableable addressing line is a gated line of a wordline driver. In accordance with at least one embodiment, the addressing line controls writing to the power control memory cell. In accordance with at least one embodiment, the apparatus further comprises an addressing line power switch coupled to the addressing line driver for gating of power to the addressing line driver. In accordance with at least one embodiment, the addressing line power switch is for allowing the addressing line driver to selectively disable the disableable addressing line.

In accordance with at least one embodiment, apparatus comprises a power control memory cell, a memory array comprising a plurality of subarrays, wherein the plurality of subarrays comprises a first subarray and other subarrays, wherein the first subarray comprises a plurality of data memory cells, an addressing line driver, and an addressing line power switch. In accordance with at least one embodiment, the addressing line driver is for receiving an addressing line and driving a disableable addressing line. In accordance with at least one embodiment, the disableable addressing line is coupled to the plurality of data memory cells. In accordance with at least one embodiment, the addressing line power switch is coupled to the power control memory cell and to the addressing line driver for gating of power to the addressing line driver. In accordance with at least one embodiment, the addressing line power switch is for allowing the addressing line driver to selectively disable the disableable addressing line. In accordance with at least one embodiment, the addressing line is a wordline.

In accordance with at least one embodiment, the other subarrays comprise other data memory cells. In accordance with at least one embodiment, the disableable addressing line is not coupled to the other data memory cells. In accordance with at least one embodiment, the addressing line driver selectively drives the disableable addressing line based on a power control memory cell state of the power control memory cell. In accordance with at least one embodiment, the power control memory cell state is based on a control bitline state of a control bitline. In accordance with at least one embodiment, the control bitline is selectively coupled to the power control memory cell. In accordance with at least one embodiment, the addressing line driver selectively drives the disableable addressing line further based on an addressing line state of the addressing line.

In accordance with at least one embodiment, the apparatus further comprises a data memory cell power switch coupled to and controlled by the power control memory cell state. In accordance with at least one embodiment, the data memory cell power switch is coupled to and controls power to the plurality of data memory cells.

What is claimed is:

1. A method comprising:
controlling a power control memory cell state of a power control memory cell based on a power control selection line state of a power control selection line, in response to the power control memory cell being selectively coupled to the power control selection line; and
gating power to data memory cells of a subarray of a memory array based on the power control memory cell state.

2. The method of claim 1 wherein the power control selection line comprises an addressable line.

3. The method of claim 2 wherein the power control memory cell is selectively coupled to the power control selection line by asserting an address line when the data memory cells of the subarray are addressed by assertion the address line.

4. The method of claim 1 further comprising:
controlling a second power control memory cell state of a second power control memory cell based on a second power control selection line state of the power control selection line, in response to the second power control memory cell being selectively coupled to the power control selection line; wherein the power control selection line is a bitline common to the power control memory cell and the second power control memory cell; and
gating power to second data memory cells of a second subarray of the memory array based on the second power control memory cell state.

5. The method of claim 1 further comprising:
gating an addressing line for selectively enabling and disabling addressing of the subarray based on the power control memory cell state.

6. The method of claim 5 wherein the step of gating the addressing line further comprises:
gating the addressing line further based on an addressing line state of the addressing line.

7. The method of claim 5 wherein the step of gating the addressing line further comprises:
gating of power to an addressing line driver for the addressing line.

8. The method of claim 5 wherein the addressing line is a wordline.

9. The method of claim 8 wherein the power control selection line is a control bitline.

10. Apparatus comprising:
a power control memory cell;
a data memory cell power switch coupled to and controlled by a power control memory cell state of the power control memory cell, wherein the power control memory cell state is based on a control bitline state of a control bitline, wherein the control bitline is selectively coupled to the power control memory cell; and
a memory array comprising a plurality of subarrays, wherein the plurality of subarrays comprises a first subarray and other subarrays, wherein the first subarray comprises a plurality of data memory cells, wherein the data memory cell power switch is coupled to and controls power to the plurality of data memory cells.

11. The apparatus of claim 10 further comprising:
complementary bit lines coupled to the power control memory cell wherein the power control memory cell state of the power control memory cell is set by a bit line state of the complementary bit lines.

12. The apparatus of claim 10 wherein the other subarrays comprise other data memory cells, wherein the data memory cell power switch does not control power to the other data memory cells.

13. The apparatus of claim 10 wherein an addressing line that controls writing to the power control memory cell is provided by a wordline driver.

14. Apparatus comprising:
a power control memory cell;
a data memory cell power switch coupled to and controlled by a power control memory cell state of the power control memory cell;
a memory array comprising a plurality of subarrays, wherein the plurality of subarrays comprises a first subarray and other subarrays, wherein the first subarray comprises a plurality of data memory cells, wherein the data memory cell power switch is coupled to and controls power to the plurality of data memory cells; and
an addressing line driver for selectively driving a disableable addressing line based on the power control memory cell state.

15. The apparatus of claim 14, the addressing line driver for driving the disableable addressing line further based on an addressing line state of an addressing line.

16. The apparatus of claim 15 wherein the addressing line controls writing to the power control memory cell.

17. The apparatus of claim 14 further comprising:
an addressing line power switch coupled to the addressing line driver for gating of power to the addressing line driver for allowing the addressing line driver to selectively disable the disableable addressing line.

18. The apparatus of claim 14 wherein the addressing line is a wordline.

19. The apparatus of claim 14 wherein the disableable addressing line is a gated line of a wordline driver.

20. The apparatus of claim 14 wherein the power control memory cell state is based on a control bitline state of a control bitline, wherein the control bitline is selectively coupled to the power control memory cell.

* * * * *